United States Patent
Cheng et al.

(10) Patent No.: US 10,483,310 B2
(45) Date of Patent: Nov. 19, 2019

(54) ISOLATION STRUCTURE FOR REDUCING CROSSTALK BETWEEN PIXELS AND FABRICATION METHOD THEREOF

(71) Applicant: TAIWAN SEMICONDUCTOR MANUFACTURING CO., LTD., Hsinchu (TW)

(72) Inventors: Yun-Wei Cheng, Taipei (TW); Yin-Chieh Huang, Tainan (TW); Chun-Hao Chou, Tainan (TW); Kuo-Cheng Lee, Tainan (TW); Hsun-Ying Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/448,690

(22) Filed: Mar. 3, 2017

(65) Prior Publication Data

US 2018/0254294 A1     Sep. 6, 2018

(51) Int. Cl.
*H01L 27/146* (2006.01)
(52) U.S. Cl.
CPC ...... *H01L 27/1463* (2013.01); *H01L 27/1464* (2013.01); *H01L 27/14629* (2013.01); *H01L 27/14685* (2013.01); *H01L 27/14621* (2013.01); *H01L 27/14627* (2013.01)

(58) Field of Classification Search
CPC ......... H01L 27/14623; H01L 27/14629; H01L 31/02327
See application file for complete search history.

(56) References Cited

U.S. PATENT DOCUMENTS

| | | | |
|---|---|---|---|
| 9,123,839 B2* | 9/2015 | Cheng | H01L 31/02327 |
| 9,356,069 B2* | 5/2016 | Wang | H01L 31/02327 |
| 2017/0040357 A1* | 2/2017 | Yu | H01L 27/1463 |

* cited by examiner

*Primary Examiner* — Mark V Prenty
(74) *Attorney, Agent, or Firm* — McClure, Qualey & Rodack, LLP

(57) ABSTRACT

An isolation structure and a method for fabricating the same are provided. The isolation structure includes a reflective layer, a first dielectric layer and a second dielectric layer. A dielectric constant of the first dielectric layer is different from that of the second dielectric layer. In the method for fabricating the isolation structure, at first, a semiconductor substrate is provided. Then, a first reflective layer is formed on the semiconductor substrate. Thereafter, the first dielectric layer is formed on the reflective layer. Thereafter, the second dielectric layer is on the first dielectric layer. Then, the first reflective layer, the first dielectric layer and the second dielectric layer are etched to form a grid structure. Thereafter, a passivation layer is formed to cover the etched first reflective layer, the etched first dielectric layer and the etched second dielectric layer.

20 Claims, 22 Drawing Sheets

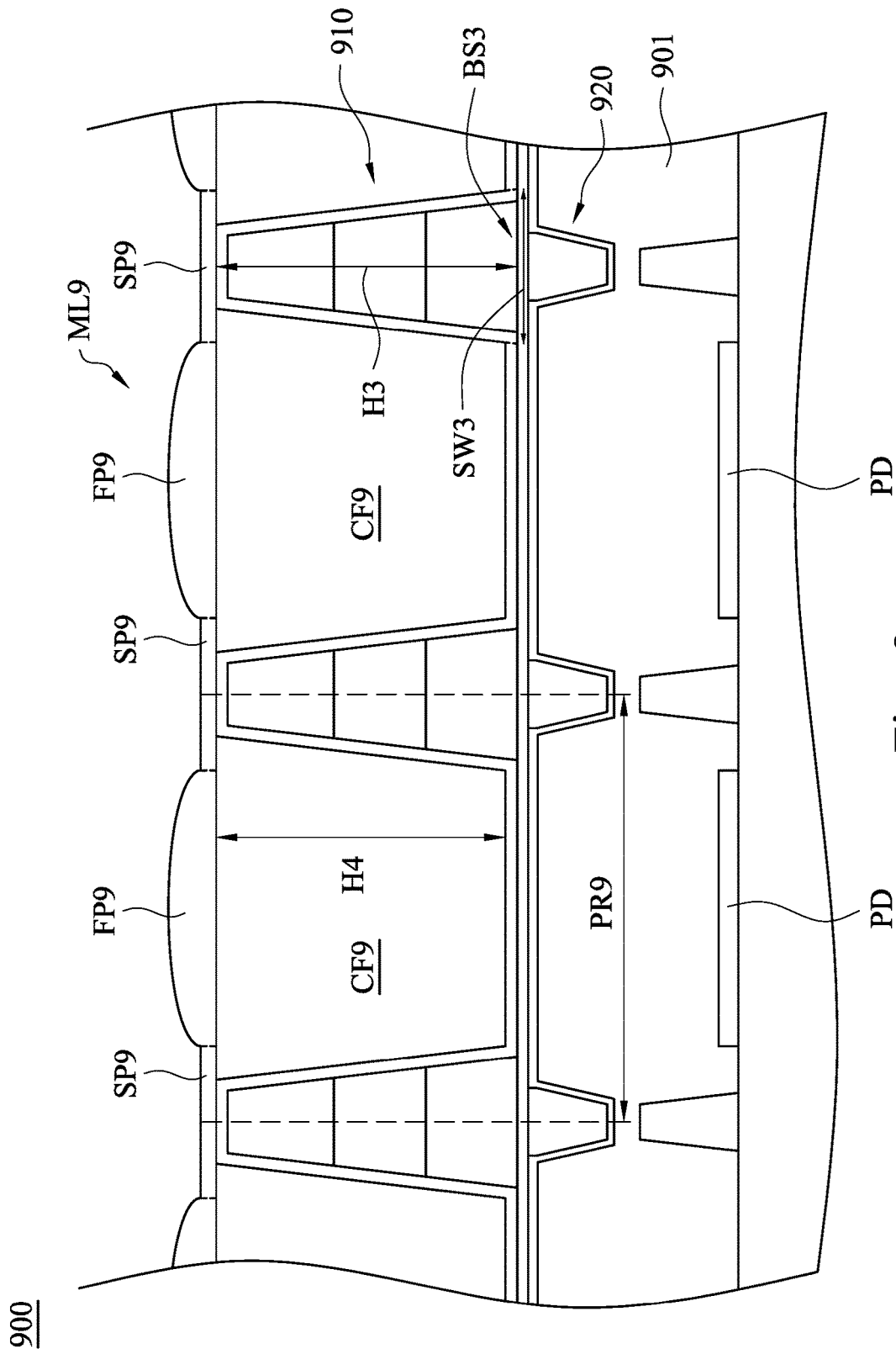

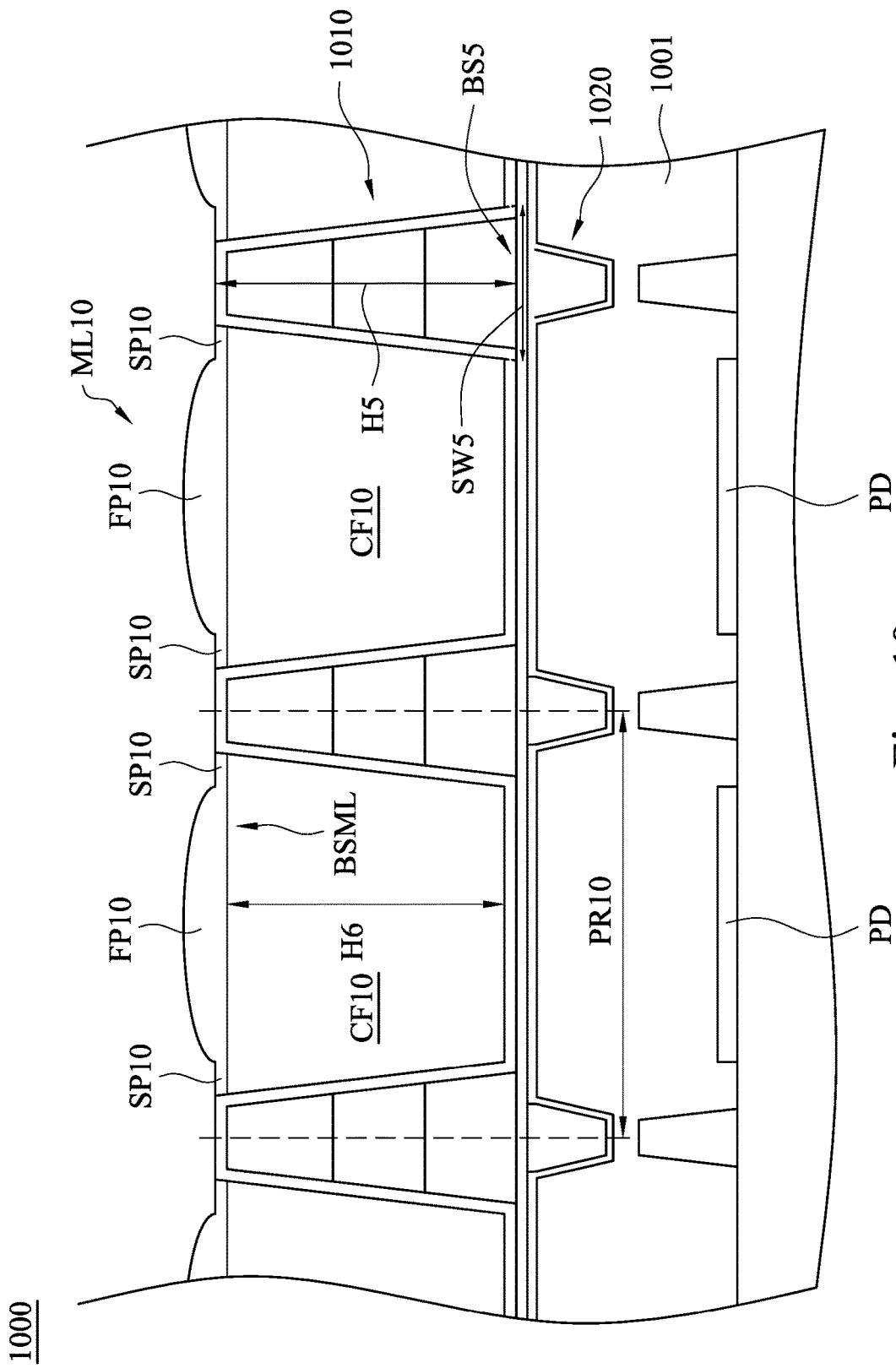

ISOLATION STRUCTURE FOR REDUCING CROSSTALK BETWEEN PIXELS AND FABRICATION METHOD THEREOF

BACKGROUND

In semiconductor technology, image sensors are used for sensing light emitted towards them to form an image. For converting various photo energy of the light into electrical signals, the image sensor includes pixels having photosensitive diodes, reset transistors, source follower transistors, pinned layer photodiodes, and/or transfer transistors. In general, the image sensor may be a complementary metal-oxide-semiconductor (CMOS) image sensor (CIS), an active-pixel sensor (APS), a passive-pixel sensor and a charged-coupled device (CCD) sensor. The above image sensor is widely used in various applications such as digital camera or mobile phone camera devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a schematic cross-sectional view of an image sensor in accordance with some embodiments of the present disclosure.

FIG. 10 is a schematic cross-sectional view of an image sensor in accordance with some embodiments of the present disclosure.

DETAILED DESCRIPTION

Figure 1A:
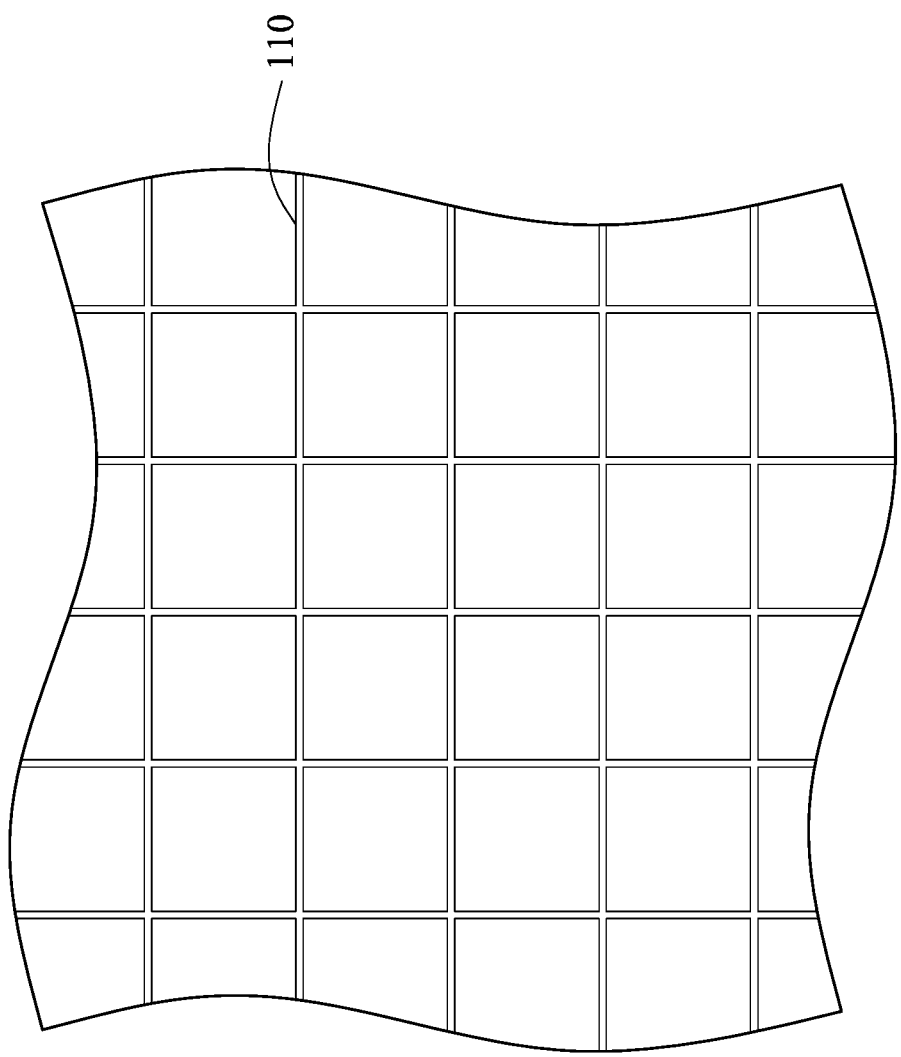
FIG. 1A is a schematic top view of an isolation structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to an isolation structure used in an image sensor to reduce crosstalk between pixels of the image sensor. The isolation structure includes a reflective layer, a first dielectric layer and a second dielectric layer, in which a dielectric constant of the first dielectric layer is different from that of the second dielectric layer. Since the isolation structure includes plural dielectric layers, the isolation structure can be formed to have a greater height, thereby providing better isolation performance.

Figure 1B:
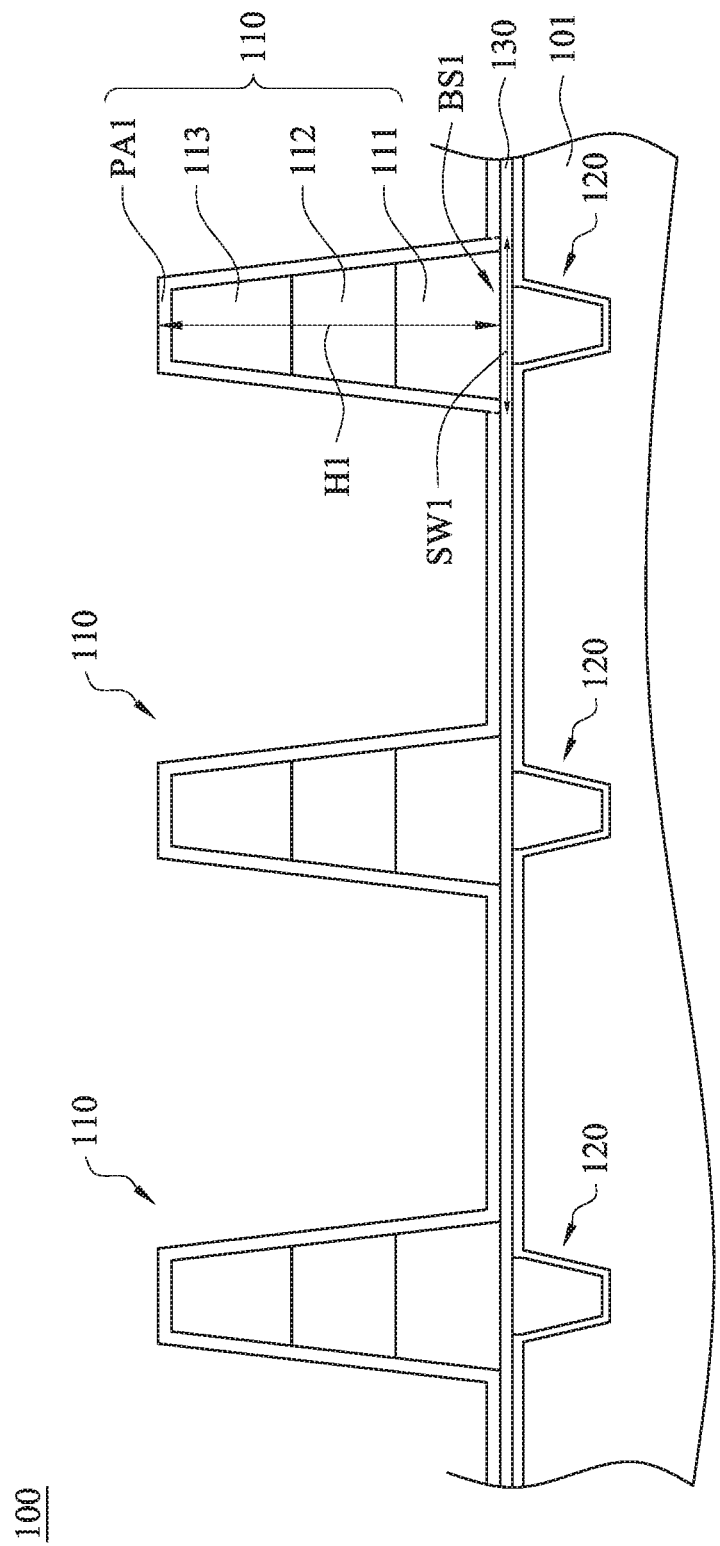
FIG. 1B is a schematic cross-sectional view of the isolation structure in accordance with some embodiments of the present disclosure.

Referring to FIG. 1A and FIG. 1B, FIG. 1A is a schematic top view of an isolation structure 100 in accordance with some embodiments of the present disclosure and FIG. 1B is a schematic cross-sectional view of the isolation structure 100 in accordance with some embodiments of the present disclosure. The isolation structure 100 includes a grid isolation structure 110 and a trench isolation structure 120 disposed on a semiconductor substrate 101. The grid isolation structure 110 is disposed on the trench isolation structure 120 to reduce crosstalk between pixels of an image sensor. In some embodiments, the trench isolation structure 120 may be formed in a grid pattern, and the grid isolation structure 110 is disposed right on the trench isolation structure 120 to cover the trench isolation structure 120. In some embodiments, a dielectric layer 130 is disposed between the grid isolation structure 110 and the trench isolation structure 120.

In some embodiments, the semiconductor substrate 101 may be a semiconductor material and may include structures including a graded layer or a buried oxide, for example. In some exemplary examples, the semiconductor substrate 101 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 101. Alternatively, the semiconductor substrate 101 may be an active layer of a semiconductor-on-insulator (SOI) substrate or a multi-layered structure such as a silicon-germanium layer formed on a bulk silicon layer.

The grid isolation structure 110 includes a reflective layer 111, a first dielectric layer 112, a second dielectric layer 113 and a passivation layer PA1 The first dielectric layer 112 is disposed on the reflective layer 111, the second dielectric layer 113 is disposed on the first dielectric layer 112, and the passivation layer PA1 is disposed on the second dielectric layer 113 and covers the reflective layer 111, the first dielectric layer 112 and the second dielectric layer 113.

The reflective layer 111 is formed from reflective material capable of reflecting light, and a dielectric constant of the first dielectric layer 112 is different from that of the second dielectric layer 113. In some embodiments, the reflective material includes metal, such as aluminum, tungsten, copper, tantalum, titanium, alloys thereof, or combinations thereof. In some embodiments, the first dielectric layer 112 and the second dielectric layer 113 are formed from silicon oxide, silicon nitride, silicon oxynitride or silicon carbide, but embodiments of the present disclosure are not limited thereto.

The reflective layer 111 is wider than the first dielectric layer 112 and the first dielectric layer 112 is wider than the second dielectric layer 113, thus a cross-sectional view of the grid isolation structure 110 has a shape of an isosceles trapezium. In some embodiments, the grid isolation structure 110 has a bottom surface BS1 and a structure height H1. The bottom surface BS3 includes a portion of the reflective layer 111 and portions of the passivation layer PA1. The bottom surface BS1 has a surface width SW1, and a ratio of the structure height H1 to the surface width SW1 is arranged to be equal to or greater than 4 to enable the grid isolation structure 110 to provide better isolation performance. In some embodiments, the ratio of the structure height H1 to the surface width SW1 ranges from 4 to 10. However, embodiments of the present disclosure are not limited thereto.

Because the grid isolation structure 110 includes the first dielectric layer 112 and the second dielectric layer 113, the grid isolation structure 110 can be formed to have a greater height, thereby providing better isolation performance for lower crosstalk and corresponding noise.

Figure 2A:
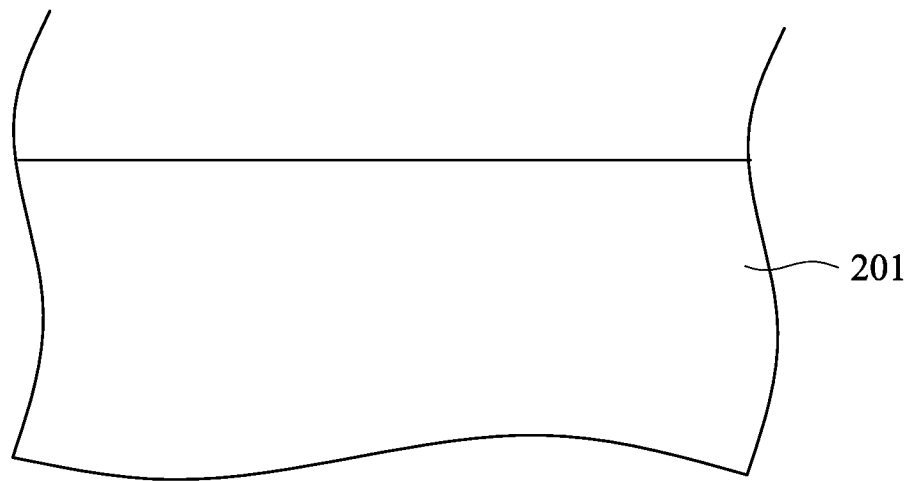
FIG. 2A to FIG. 2G are schematic cross-sectional views of intermediate stages showing the method for fabricating an isolation structure in accordance with some embodiments of the present disclosure.
Figure 2B:
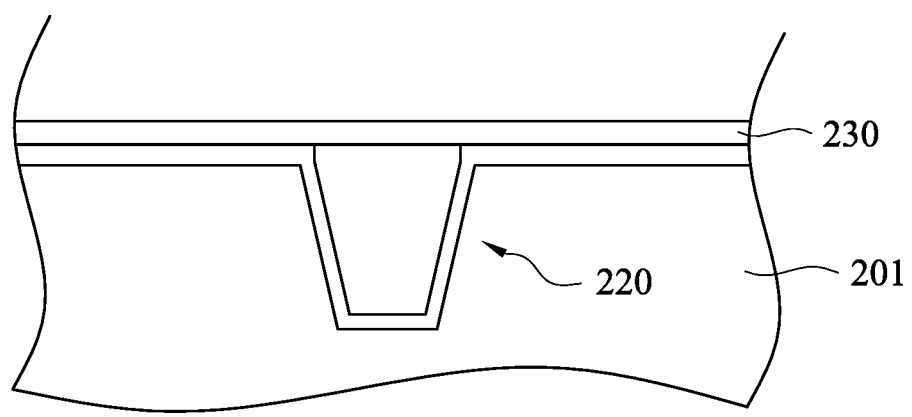

Referring to FIG. 2A to FIG. 2G are cross-sectional views of intermediate stages showing a method for fabricating an isolation structure in accordance with some embodiments of the present disclosure. As shown in FIG. 2A, a semiconductor substrate 2 is provided at first. Then, a trench isolation structure 220 is formed in the semiconductor substrate 201, as shown in FIG. 2B. In some embodiments, a dielectric layer 230 is formed on the trench isolation structure 220. The dielectric layer 230 can be formed by using a deposition process such as an atomic layer deposition (ALD). Other methods to form the dielectric layer 230 include chemical vapor deposition (CVD), physical vapor deposition (PVD), and plasma enhanced chemical vapor deposition (PECVD).

Figure 2C:
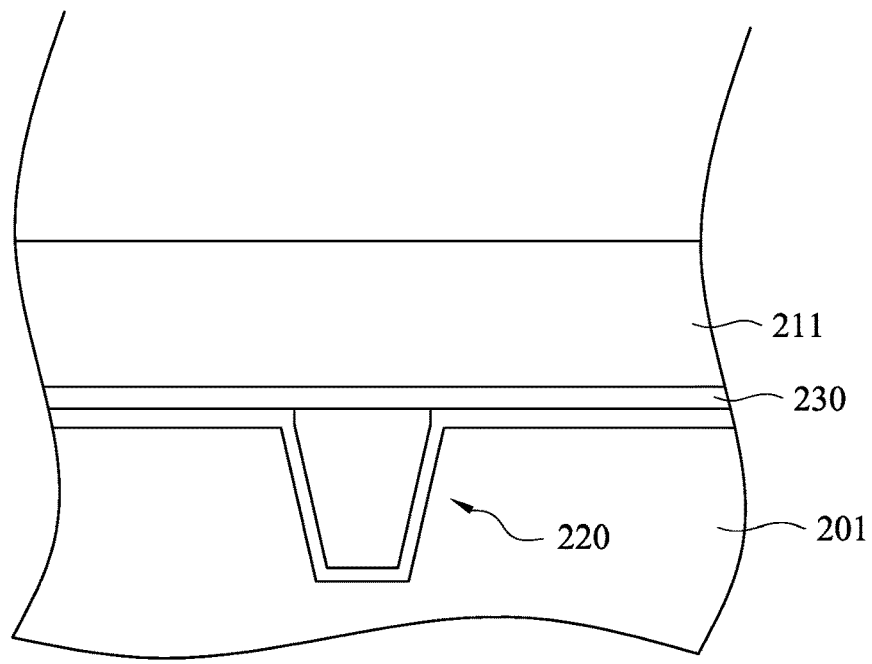

Thereafter, a reflective layer 211 is formed on the semiconductor substrate 201 as shown in FIG. 2C. The reflective layer 211 is formed from reflective material capable of reflecting light. In some embodiments, the reflective material includes metal, such as aluminum, tungsten, copper, tantalum, titanium, alloys thereof, or combinations thereof. The reflective layer 211 can be formed by using a deposition process such as an atomic layer deposition (ALD). Other methods to form the reflective layer 211 include chemical vapor deposition (CVD), physical vapor deposition (PVD), and plasma enhanced chemical vapor deposition (PECVD).

Figure 2D:
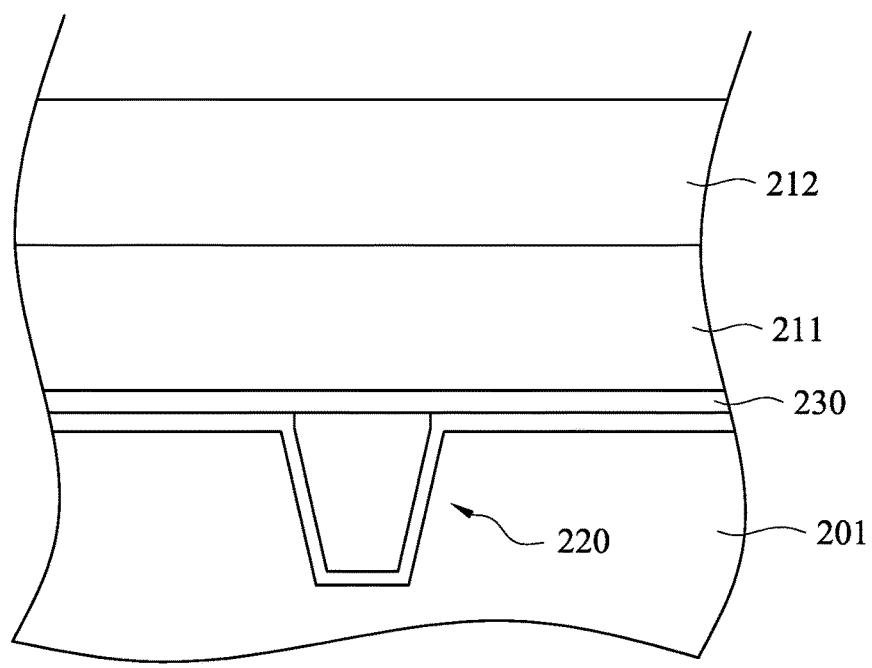

Then, a first dielectric layer 212 is formed on the reflective layer 211 as shown in FIG. 2D. In some embodiments, the first dielectric layer 212 is formed from silicon oxide, silicon nitride, silicon oxynitride or silicon carbide. In some embodiments, the first dielectric layer 212 can be formed by using a deposition process such as an atomic layer deposition (ALD). Other methods to form the first dielectric layer 212 include chemical vapor deposition (CVD), physical vapor deposition (PVD), and plasma enhanced chemical vapor deposition (PECVD).

Figure 2E:
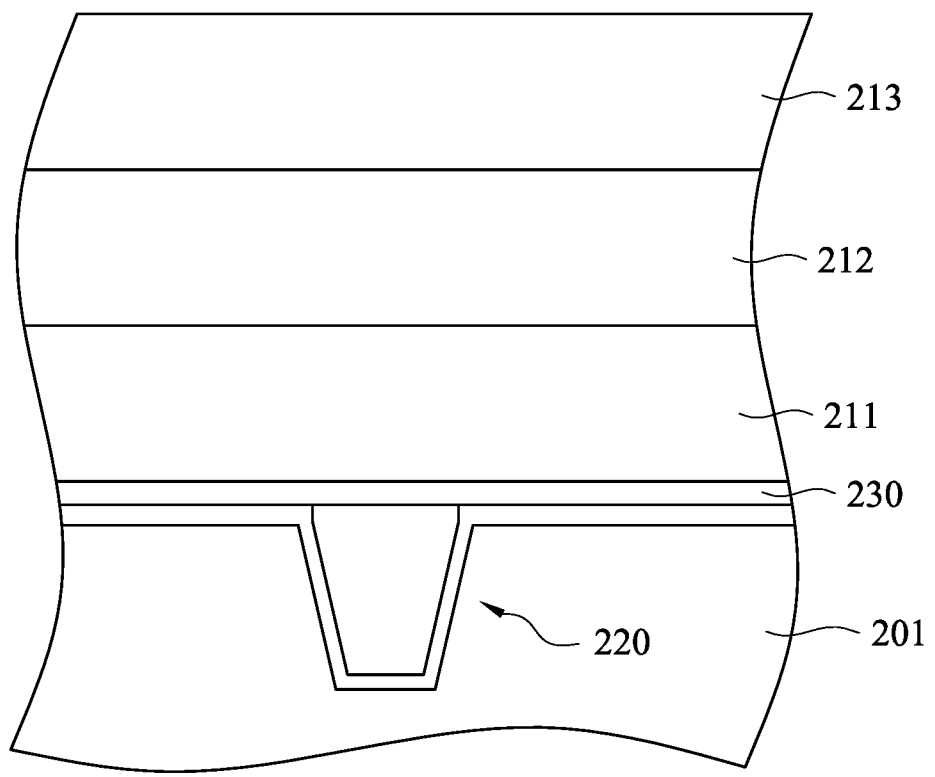

Thereafter, a second dielectric layer 213 is formed on the first dielectric layer 212 as shown in FIG. 2E. In some embodiments, the dielectric constant of the second dielectric layer 213 is different from the dielectric constant of the first dielectric layer 212. In some embodiments, the second dielectric layer 213 is formed from silicon oxide, silicon nitride, silicon oxynitride or silicon carbide. In some embodiments, the second dielectric layer 213 can be formed by using a deposition process such as an atomic layer deposition (ALD). Other methods to form the second dielectric layer 213 include chemical vapor deposition (CVD), physical vapor deposition (PVD), and plasma enhanced chemical vapor deposition (PECVD).

Figure 2F:
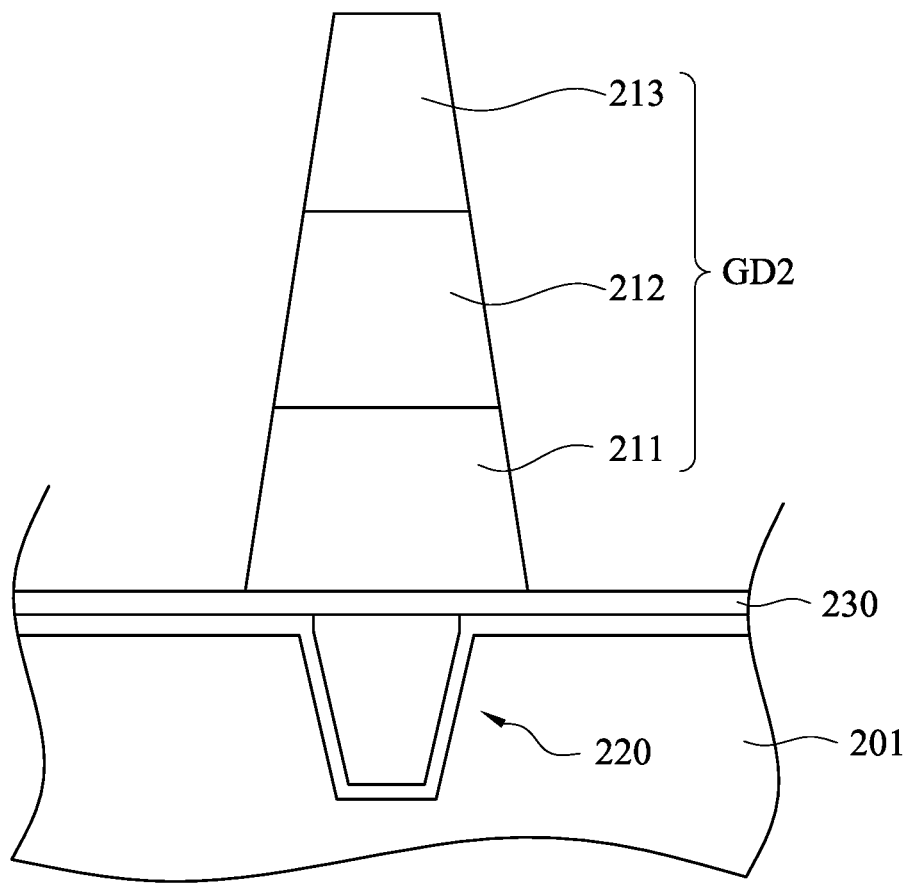

Then, the reflective layer 211, the first dielectric layer 212 and the second dielectric layer 213 are etched as shown in FIG. 2F. After the reflective layer 211, the first dielectric layer 212 and the second dielectric layer 213 are etched, a grid structure GD2 is formed on the semiconductor substrate 201. The grid structure GD2 includes the etched reflective layer 211, the etched first dielectric layer 212 and the etched second dielectric layer 213. The etched reflective layer 211 is wider than the etched first dielectric layer 212 and the etched first dielectric layer 212 is wider than the etched second dielectric layer 213, thus a cross-sectional view of the grid structure GD2 has a shape of an isosceles trapezium.

Figure 2G:
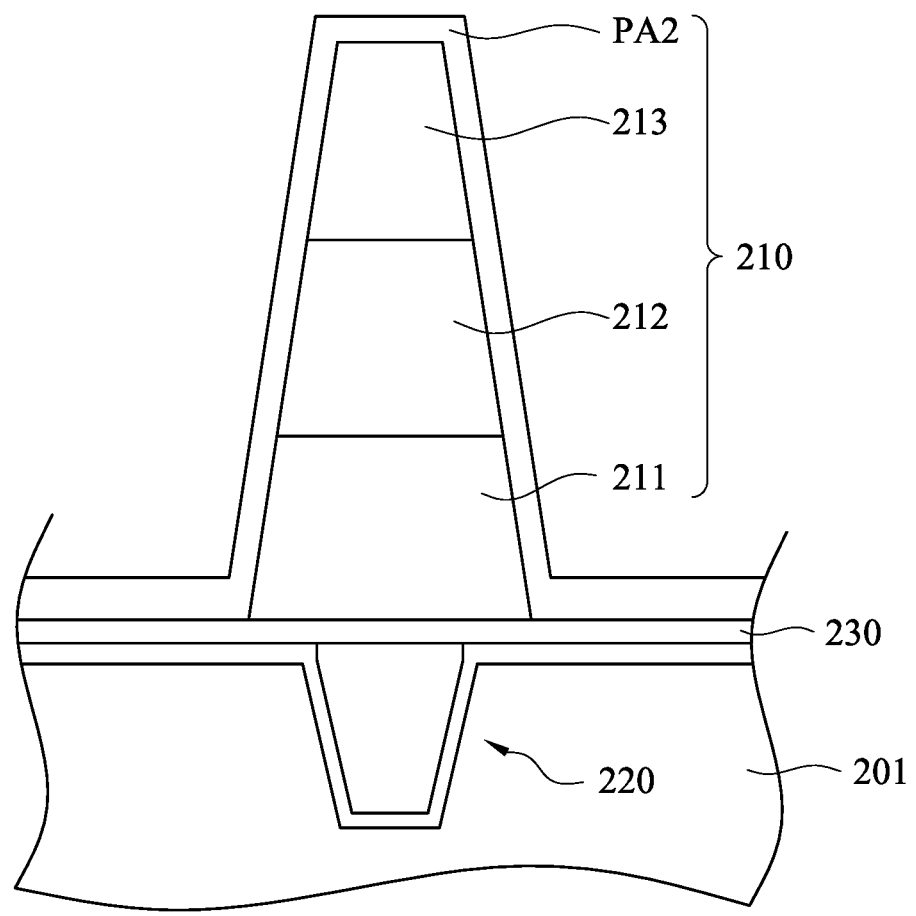

Thereafter, a passivation layer PA2 is formed to cover the etched reflective layer 211, the etched first dielectric layer 212 and the etched second dielectric layer 213 to form a grid isolation structure 210 on the semiconductor substrate 201, as shown in FIG. 2G. In some embodiments, the passivation layer PA2 also covers the dielectric layer 230. In some embodiments, the passivation layer PA2 can be formed by using a deposition process such as an atomic layer deposition (ALD). Other methods to form the passivation layer PA2 include chemical vapor deposition (CVD), physical vapor deposition (PVD), and plasma enhanced chemical vapor deposition (PECVD). In some embodiments, the grid isolation structure 210 is substantially geometrically similar to the grid isolation structure 110.

Figure 3:
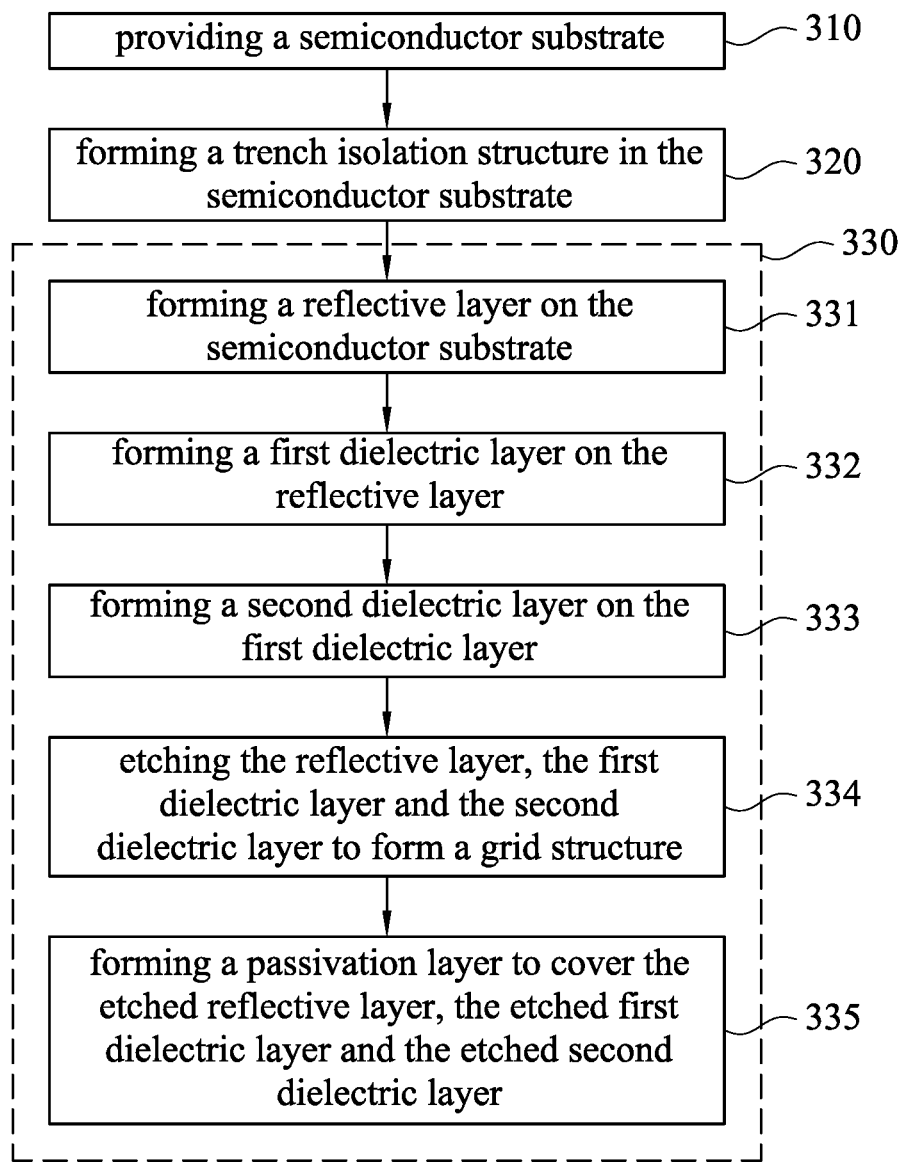
FIG. 3 is a flow chart showing a method for fabricating an isolation structure in accordance with embodiments of the present disclosure.

Referring to FIG. 3, FIG. 3 is a flow chart showing a method 300 for fabricating an isolation structure in accordance with embodiments of the present disclosure. The method 300 begins at operation 310. Operation 310 is performed to provide the semiconductor substrate 201 as shown in FIG. 2A. Then, operation 320 is performed to form the trench isolation structure 220 in the semiconductor substrate 201, as shown in FIG. 2B. Thereafter, operation 330 is performed to form a grid isolation structure on the semiconductor substrate 201. In operation 330, at first, operation 331 is performed to form the reflective layer 211 on the semiconductor substrate 201 as shown in FIG. 2C. Then, operation 332 is performed to form the first dielectric layer 212 on the reflective layer 211 as shown in FIG. 2D. Thereafter, operation 333 is performed to form the second dielectric layer 213 on the first dielectric layer 212 as shown in FIG. 2E. Then, operation 334 is performed to etch the reflective layer 211, the first dielectric layer 212 and the second dielectric layer 213 as shown in FIG. 2F. Thereafter, operation 335 is performed to form a passivation layer PA2 to cover the etched reflective layer 211, the etched first dielectric layer 212 and the etched second dielectric layer 213 to form the grid isolation structure 210 on the semiconductor substrate 201, as shown in FIG. 2G.

Figure 4A:
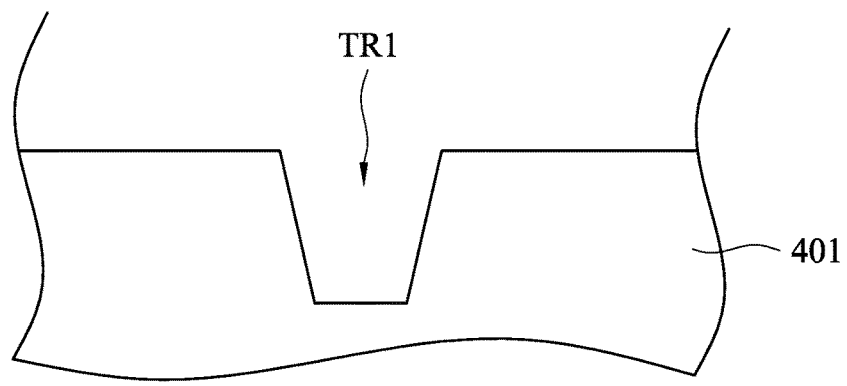
FIG. 4A to FIG. 4E are schematic cross-sectional views of intermediate stages showing the method for fabricating a trench isolation structure in accordance with some embodiments of the present disclosure.

Referring to FIG. 4A to FIG. 4E, FIG. 4A to FIG. 4E are schematic cross-sectional views of intermediate stages showing the method for fabricating a trench isolation structure in accordance with some embodiments of the present disclosure. As shown in FIG. 4A, a trench TR1 is formed in a semiconductor substrate 401. The trench TR1 is formed in a grid pattern. In some embodiments, the trench TR1 can be formed by a wet etching process or a dry etching process. In some embodiments, the semiconductor substrate 401 may be a semiconductor material and may include structures including a graded layer or a buried oxide, for example. In some exemplary examples, the semiconductor substrate 401 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 401. Alternatively, the semiconductor substrate 401 may be an active layer of a semiconductor-on-insulator (SOI) substrate or a multi-layered structure such as a silicon-germanium layer formed on a bulk silicon layer.

Figure 4B:
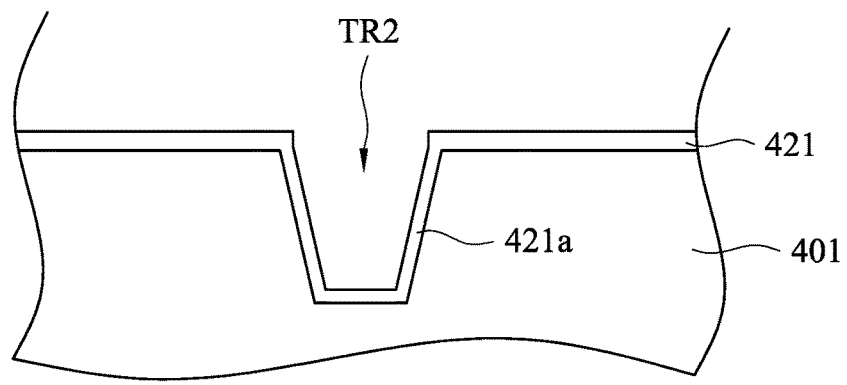

Then, a dielectric layer 421 to cover the semiconductor substrate 401 as shown in FIG. 4B. The dielectric layer 421 includes a trench portion 421a formed in the trench TR1, thereby forming another trench TR2. In some embodiments, the dielectric layer 421 is formed from high-k dielectric material. The high-k material may include hafnium oxide (HfO2), hafnium silicon oxide (HfSiO), hafnium silicon oxynitride (HfSiON), hafnium tantalum oxide (HfTaO), hafnium titanium oxide (HMO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO2-Al2O3) alloy, or another suitable material. In some embodiments, the dielectric layer 521 can be formed by using a deposition process such as an atomic layer deposition (ALD). Other methods to form the dielectric layer 421 include chemical vapor deposition (CVD), physical vapor deposition (PVD), and plasma enhanced chemical vapor deposition (PECVD).

Figure 4C:
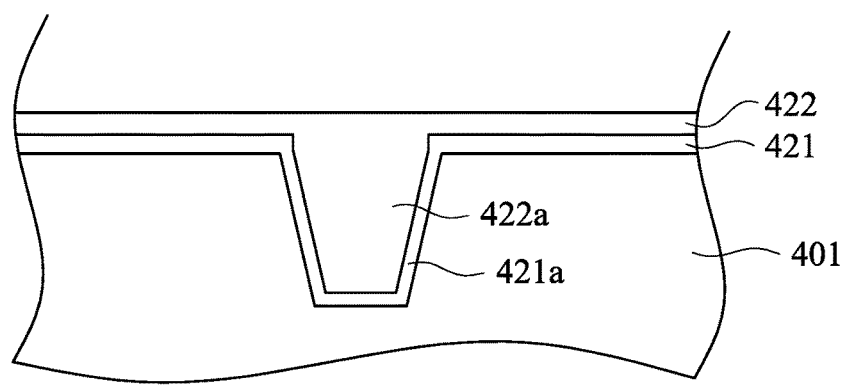
Figure 4D:
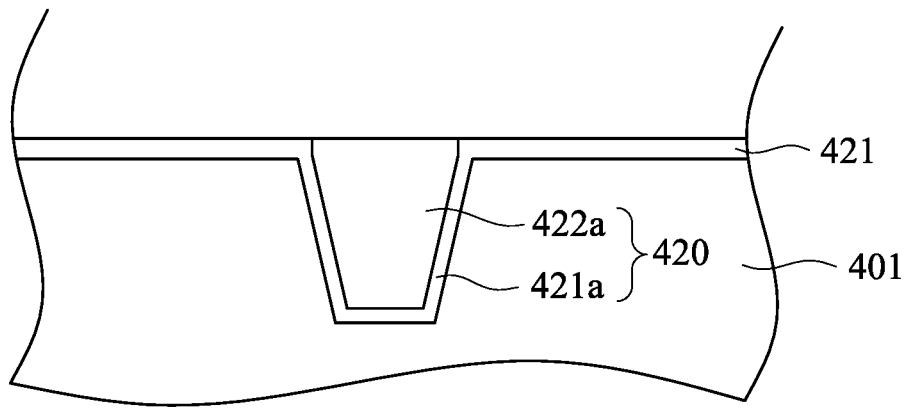
Figure 4E:
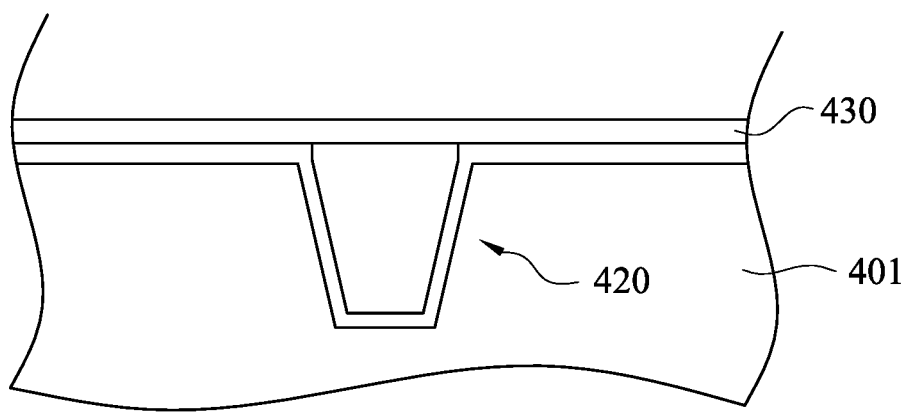

Thereafter, a reflective layer 422 is formed to cover the dielectric layer 421, thereby filling trench TR2 with a portion 422a of the reflective layer 422, as shown in FIG. 4C. Then, the reflective layer 422 is polished and the portion 422a of the reflective layer 422 is remained in the trench TR2 to form a trench isolation structure 420, as shown in FIG. 4D. In some embodiments, a dielectric layer 430 can be formed to cover the trench isolation structure 420 as shown in FIG. 4E.

Figure 5:
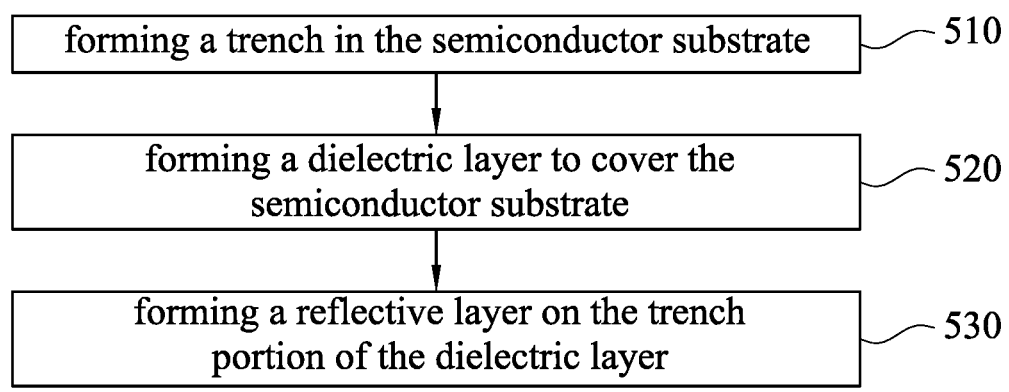
FIG. 5 is a flow chart showing a method for fabricating a trench isolation structure in accordance with embodiments of the present disclosure.

FIG. 5 is a flow chart showing a method 500 for fabricating a trench isolation structure in accordance with embodiments of the present disclosure. The method 500 begins at operation 510. Operation 510 is performed to form the trench TR1 in the semiconductor substrate 401 as shown in FIG. 4A. Then, operation 520 is performed to form the dielectric layer 421 to cover the semiconductor substrate 401 as shown in FIG. 4B. Thereafter, operation 530 is performed to form a reflective layer on the trench portion 421a of the dielectric layer 421, as shown in FIG. 4C and FIG. 4D.

Figure 6A:
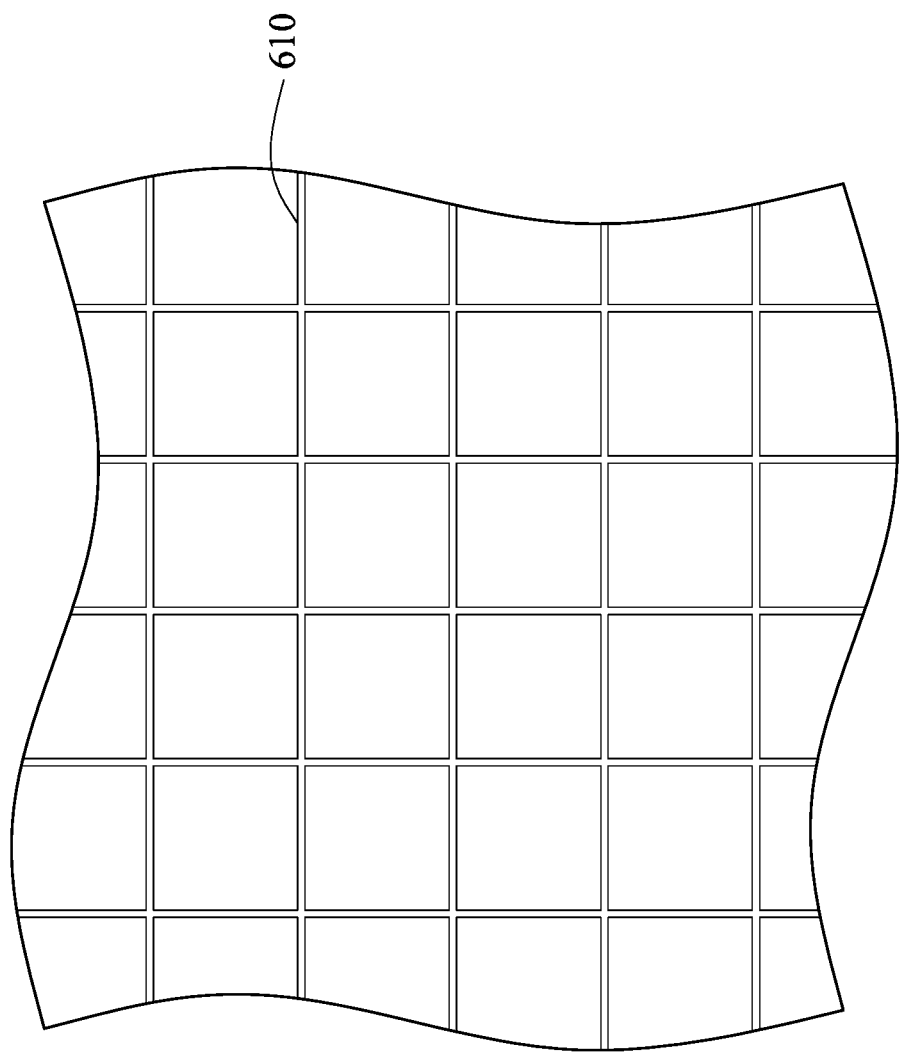
FIG. 6A is a schematic top view of an isolation structure in accordance with some embodiments of the present disclosure.
Figure 6B:
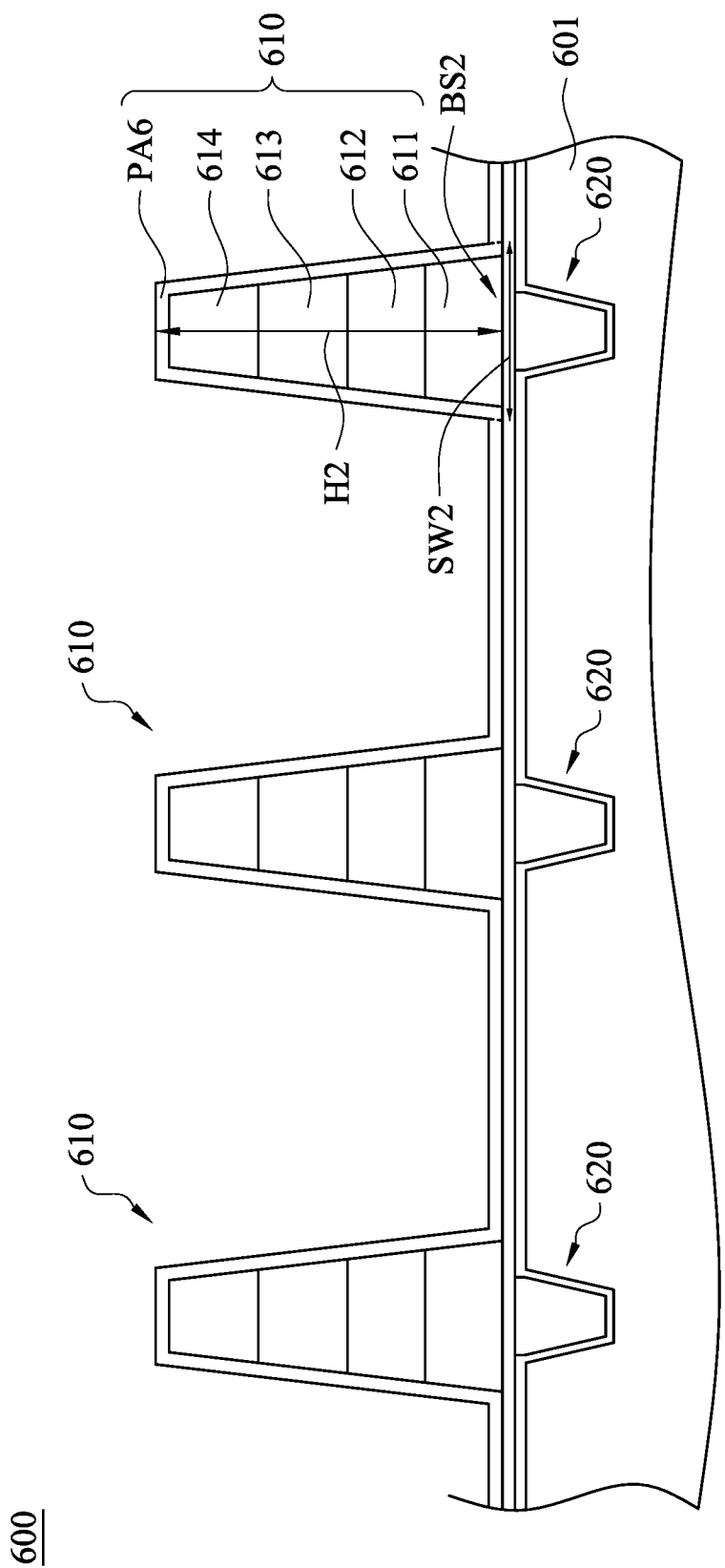
FIG. 6B is a schematic cross-sectional view of the isolation structure in accordance with embodiments of the present disclosure.

Referring to FIG. 6A and FIG. 6B, FIG. 6A is a schematic top view of an isolation structure 600 in accordance with some embodiments of the present disclosure and FIG. 6B is a schematic cross-sectional view of the isolation structure 600 in accordance with some embodiments of the present disclosure. The isolation structure 600 includes a grid isolation structure 610 and a trench isolation structure 620 disposed on a semiconductor substrate 601. The grid isolation structure 610 is disposed on the trench isolation structure 620 to reduce crosstalk between pixels of an image sensor. In some embodiments, the trench isolation structure 620 may be formed in a grid pattern, and the grid isolation structure 610 is disposed right on the trench isolation structure 620 to cover the trench isolation structure 620. In some embodiments, a dielectric layer 630 is disposed between the grid isolation structure 610 and the trench isolation structure 620.

In some embodiments, the semiconductor substrate 601 may be a semiconductor material and may include structures including a graded layer or a buried oxide, for example. In some exemplary examples, the semiconductor substrate 601 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 601. Alternatively, the semiconductor substrate 601 may be an active layer of a semiconductor-on-insulator (SOI) substrate or a multi-layered structure such as a silicon-germanium layer formed on a bulk silicon layer.

The grid isolation structure 610 includes a reflective layer 611, a first dielectric layer 612, a second dielectric layer 613, a third dielectric layer 614 and a passivation layer PA6. The first dielectric layer 612 is disposed on the reflective layer 611, the second dielectric layer 613 is disposed on the first dielectric layer 612, the third dielectric layer 614 is disposed on the second dielectric layer 613, and the passivation layer PA6 is disposed on the third dielectric layer 614 and covers the reflective layer 611, the first dielectric layer 612, the second dielectric layer 613 and the third dielectric layer 614.

The reflective layer 611 is formed from reflective material capable of reflecting light. In some embodiments, the reflective material includes metal, such as aluminum, tungsten, copper, tantalum, titanium, alloys thereof, or combinations thereof. However, embodiments of the present disclosure are not limited thereto.

The dielectric constants of the first dielectric layer 612, the second dielectric layer 613 and the third dielectric layer 614 are different from each other. In some embodiments, the dielectric constant of the first dielectric layer 612 is greater than the dielectric constant of the second dielectric layer 613, and the dielectric constant of the second dielectric layer 613 is greater than the dielectric constant of the third dielectric layer 614. In some embodiments, the dielectric constant of the first dielectric layer 612 is smaller than the dielectric constant of the second dielectric layer 613, and the dielectric constant of the second dielectric layer 613 is smaller than the dielectric constant of the third dielectric layer 614.

Further, in some embodiments, the first dielectric layer 612, the second dielectric layer 613 and the third dielectric layer 614 are formed from silicon oxide, silicon nitride, silicon oxynitride or silicon carbide, but embodiments of the present disclosure are not limited thereto.

The reflective layer 611 is wider than the first dielectric layer 612, the first dielectric layer 612 is wider than the second dielectric layer 613, and the second dielectric layer 613 is wider than the third dielectric layer 614, thus a cross-sectional view of the grid isolation structure 610 has a shape of an isosceles trapezium. In some embodiments, the grid isolation structure 610 has a bottom surface BS2 and a structure height H2. The bottom surface BS2 includes a portion of the reflective layer 611 and portions of the passivation layer PA6. The bottom surface BS2 has a surface width SW2, and a ratio of the structure height H2 to the surface width SW2 is arranged to be equal to or greater than 4 to enable the grid isolation structure 610 to provide better isolation performance. In some embodiments, the ratio of the structure height H2 to the surface width SW2 ranges from 4 to 10. However, embodiments of the present disclosure are not limited thereto.

Because the grid isolation structure 610 includes the first dielectric layer 612, the second dielectric layer 613 and the third dielectric layer 614, the grid isolation structure 610 can be formed to have a greater height, thereby providing better isolation performance for lower crosstalk and corresponding noise.

Figure 7A:
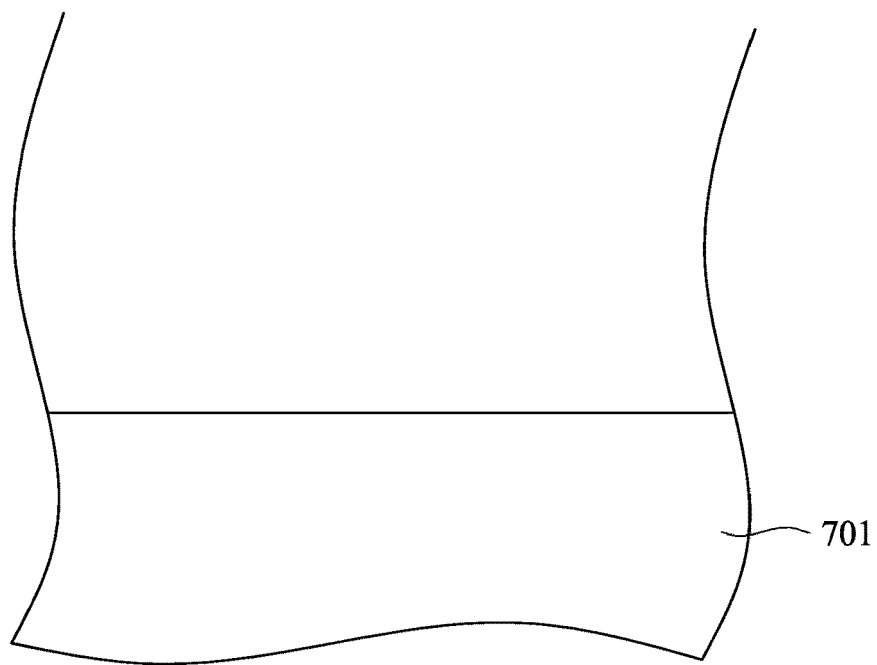
FIG. 7A to FIG. 7H are schematic cross-sectional views of intermediate stages showing the method for fabricating an isolation structure in accordance with some embodiments of the present disclosure.
Figure 7B:
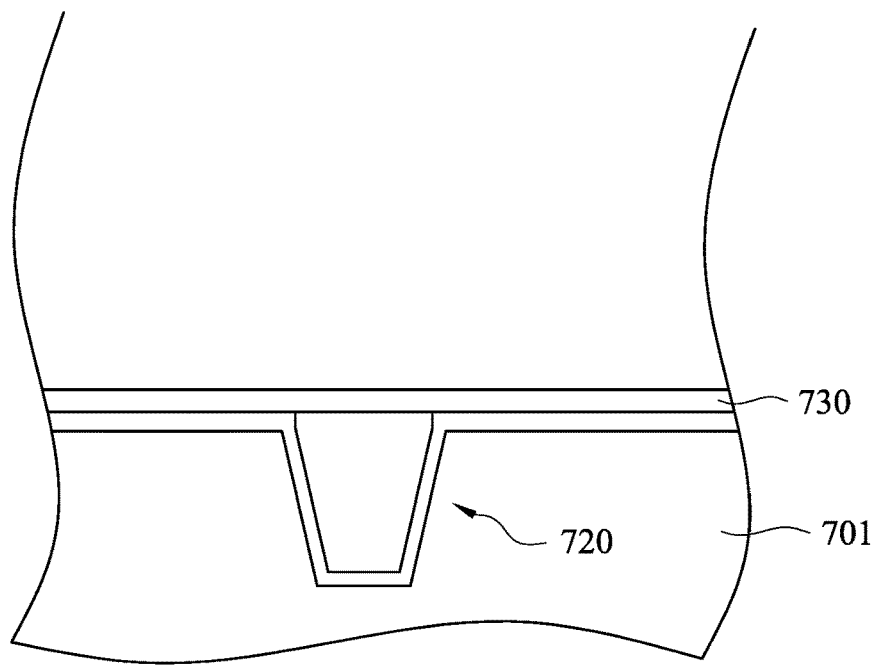

Referring to FIG. 7A to FIG. 7H, FIG. 7A to FIG. 7H are schematic cross-sectional views of intermediate stages showing a method for fabricating an isolation structure in accordance with some embodiments of the present disclosure. As shown in FIG. 7A, a semiconductor substrate 701 is provided at first. Then, a trench isolation structure 720 is formed in the semiconductor substrate 701, as shown in FIG. 7B. In some embodiments, a dielectric layer 730 is formed on the trench isolation structure 720. The dielectric layer 730 can be formed by using a deposition process such as an atomic layer deposition (ALD). Other methods to form the dielectric layer 730 include chemical vapor deposition (CVD), physical vapor deposition (PVD), and plasma enhanced chemical vapor deposition (PECVD).

Figure 7C:
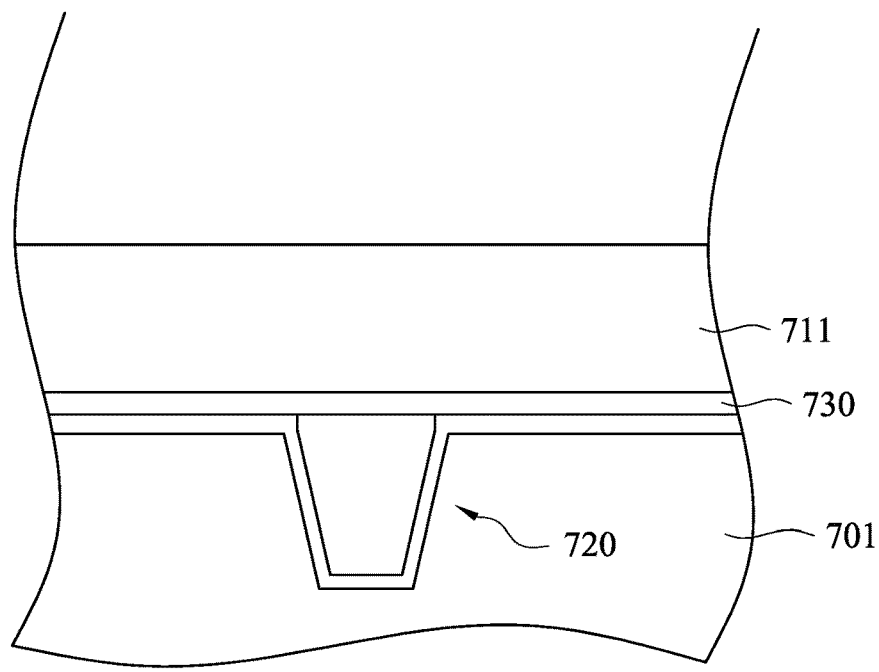

Thereafter, a reflective layer 711 is formed on the semiconductor substrate 701 as shown in FIG. 7C. The reflective layer 711 is formed from reflective material capable of reflecting light. In some embodiments, the reflective material includes metal, such as aluminum, tungsten, copper, tantalum, titanium, alloys thereof, or combinations thereof. The reflective layer 711 can be formed by using a deposition process such as an atomic layer deposition (ALD). Other methods to form the reflective layer 711 include chemical vapor deposition (CVD), physical vapor deposition (PVD), and plasma enhanced chemical vapor deposition (PECVD).

Figure 7D:
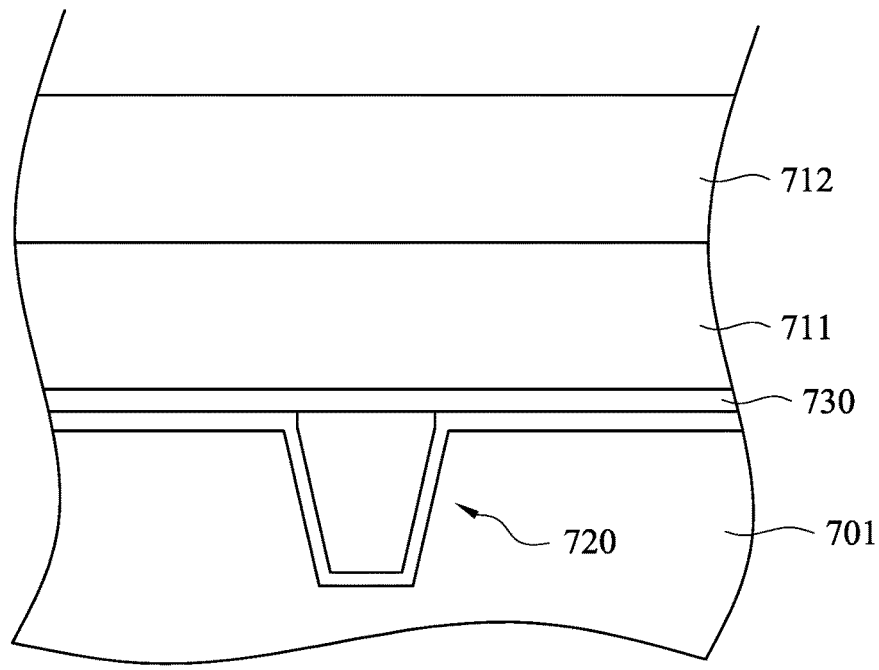

Then, a first dielectric layer 712 is formed on the reflective layer 711 as shown in FIG. 7D. In some embodiments, the first dielectric layer 712 is formed from silicon oxide, silicon nitride, silicon oxynitride or silicon carbide. In some embodiments, the first dielectric layer 712 can be formed by using a deposition process such as an atomic layer deposition (ALD). Other methods to form the first dielectric layer 712 include chemical vapor deposition (CVD), physical vapor deposition (PVD), and plasma enhanced chemical vapor deposition (PECVD).

Figure 7E:
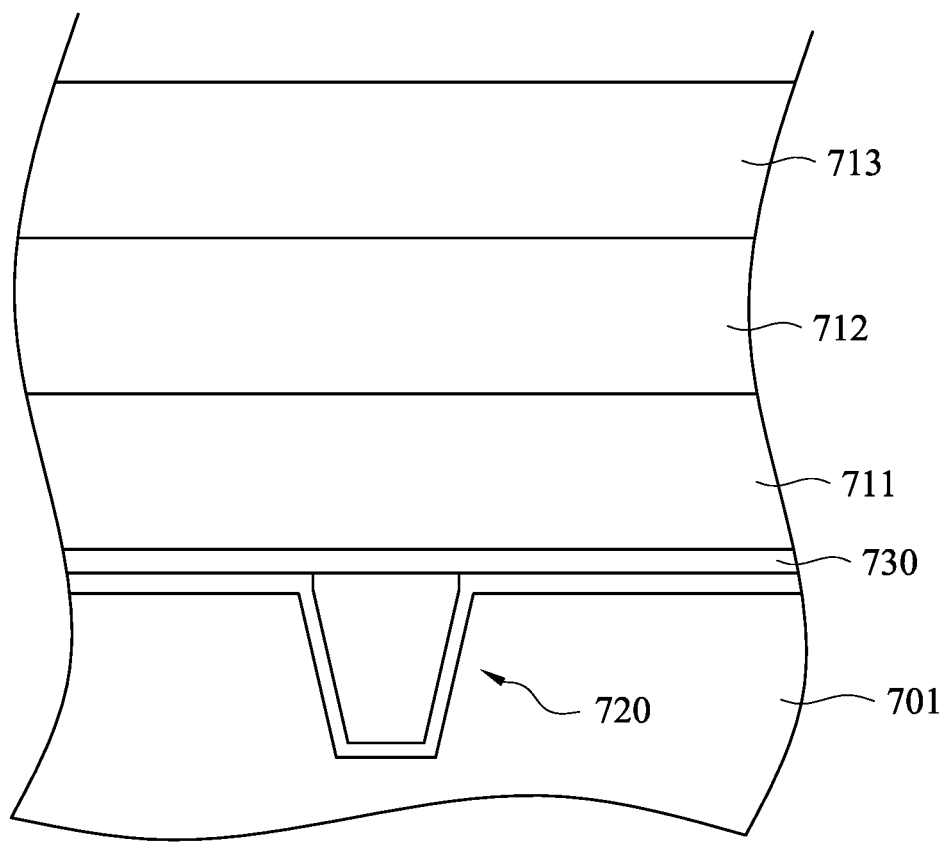

Thereafter, a second dielectric layer 713 is formed on the first dielectric layer 712 as shown in FIG. 7E. In some embodiments, the dielectric constant of the second dielectric layer 713 is different from the dielectric constant of the first dielectric layer 712. In some embodiments, the second dielectric layer 713 is formed from silicon oxide, silicon nitride, silicon oxynitride or silicon carbide. In some embodiments, the second dielectric layer 713 can be formed by using a deposition process such as an atomic layer deposition (ALD). Other methods to form the second dielectric layer 713 include chemical vapor deposition (CVD), physical vapor deposition (PVD), and plasma enhanced chemical vapor deposition (PECVD).

Figure 7F:
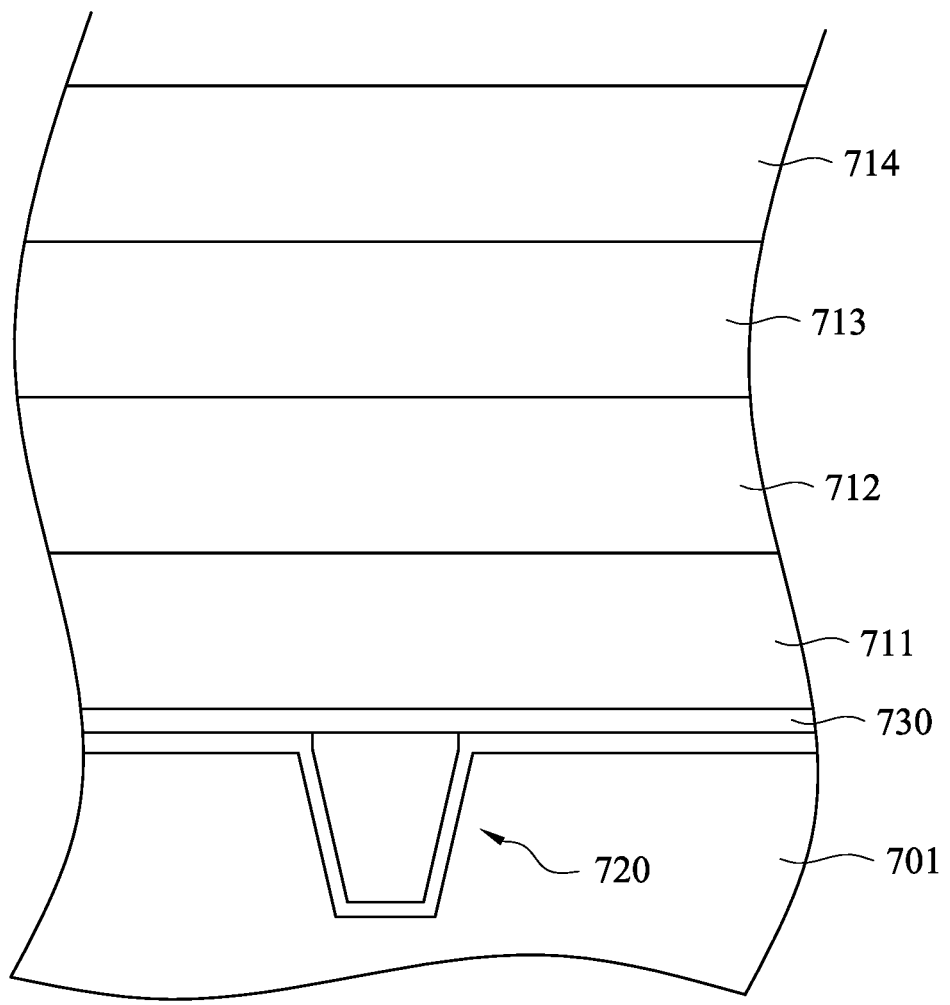

Then, a third dielectric layer 714 is formed on the second dielectric layer 713 as shown in FIG. 7F. In some embodiments, the dielectric constant of the first dielectric layer 712 is greater than the dielectric constant of the second dielectric layer 713, and the dielectric constant of the second dielectric layer 713 is greater than the dielectric constant of the third dielectric layer 714. In some embodiments, the dielectric constant of the first dielectric layer 712 is smaller than the dielectric constant of the second dielectric layer 713, and the dielectric constant of the second dielectric layer 713 is smaller than the dielectric constant of the third dielectric layer 714.

In some embodiments, the third dielectric layer 714 is formed from silicon oxide, silicon nitride, silicon oxynitride or silicon carbide. In some embodiments, the third dielectric layer 714 can be formed by using a deposition process such as an atomic layer deposition (ALD). Other methods to form third dielectric layer 714 include chemical vapor deposition (CVD), physical vapor deposition (PVD), and plasma enhanced chemical vapor deposition (PECVD).

Figure 7G:
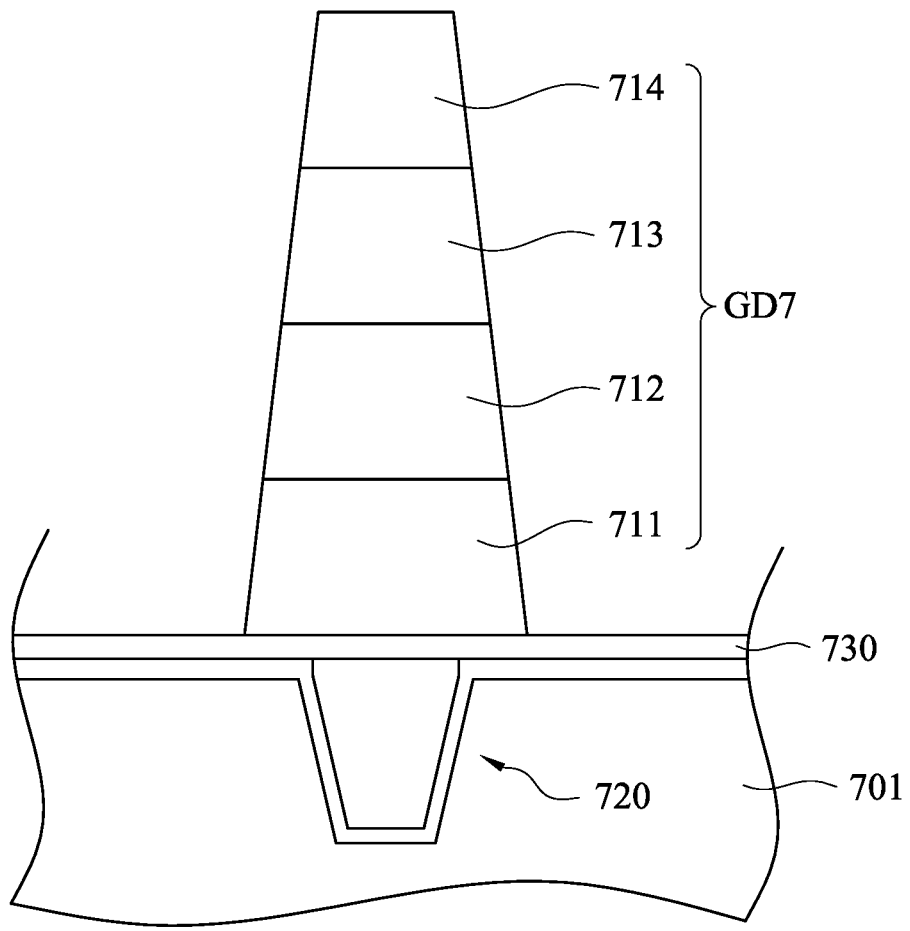

Then, the reflective layer 711, the first dielectric layer 712, the second dielectric layer 713 and the third dielectric layer 714 are etched, as shown in FIG. 7G. After the reflective layer 711, the first dielectric layer 712, the second dielectric layer 713 and the third dielectric layer 714 are etched, a grid structure GD7 is formed on the semiconductor substrate 701. The grid structure GD7 includes the etched reflective layer 711, the etched first dielectric layer 712, the etched second dielectric layer 713 and the etched third dielectric layer 714. The etched reflective layer 711 is wider than the etched first dielectric layer 712, and the etched first dielectric layer 712 is wider than the etched second dielectric layer 713, and the etched second dielectric layer 713 is wider than the etched third dielectric layer 714, thus a cross-sectional view of the grid structure GD7 has a shape of an isosceles trapezium. In some embodiments, operation 735 can be formed by a wet etching process, but embodiments of the present disclosure are not limited thereto.

Figure 7H:
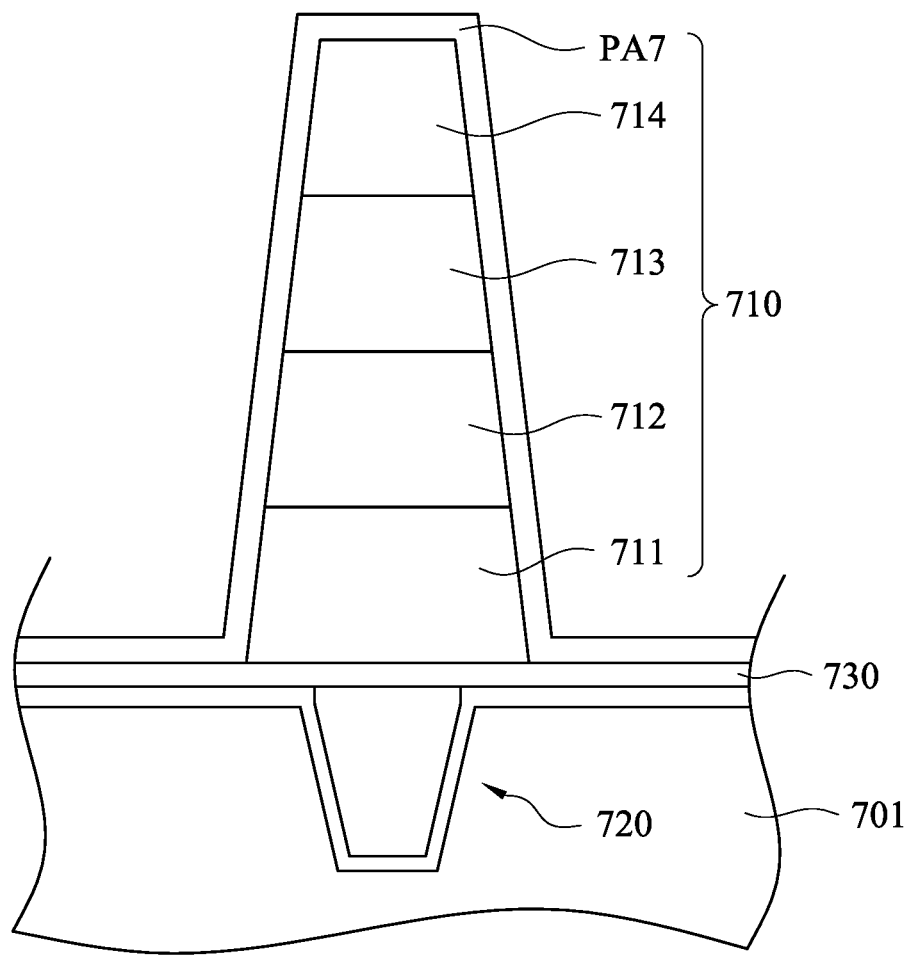

Thereafter, a passivation layer PA7 to cover the etched reflective layer 711, the etched first dielectric layer 712, the etched second dielectric layer 713 and the etched third dielectric layer 714 to form a grid isolation structure 710 on the semiconductor substrate 701, as shown in FIG. 7H. In some embodiments, the passivation layer PA7 also covers the dielectric layer 730. In some embodiments, the passivation layer PA7 can be formed by using a deposition process such as an atomic layer deposition (ALD). Other methods to form the passivation layer PA7 include chemical vapor deposition (CVD), physical vapor deposition (PVD), and plasma enhanced chemical vapor deposition (PECVD). In some embodiments, the grid isolation structure 710 is substantially geometrically similar to the grid isolation structure 610.

Figure 8:
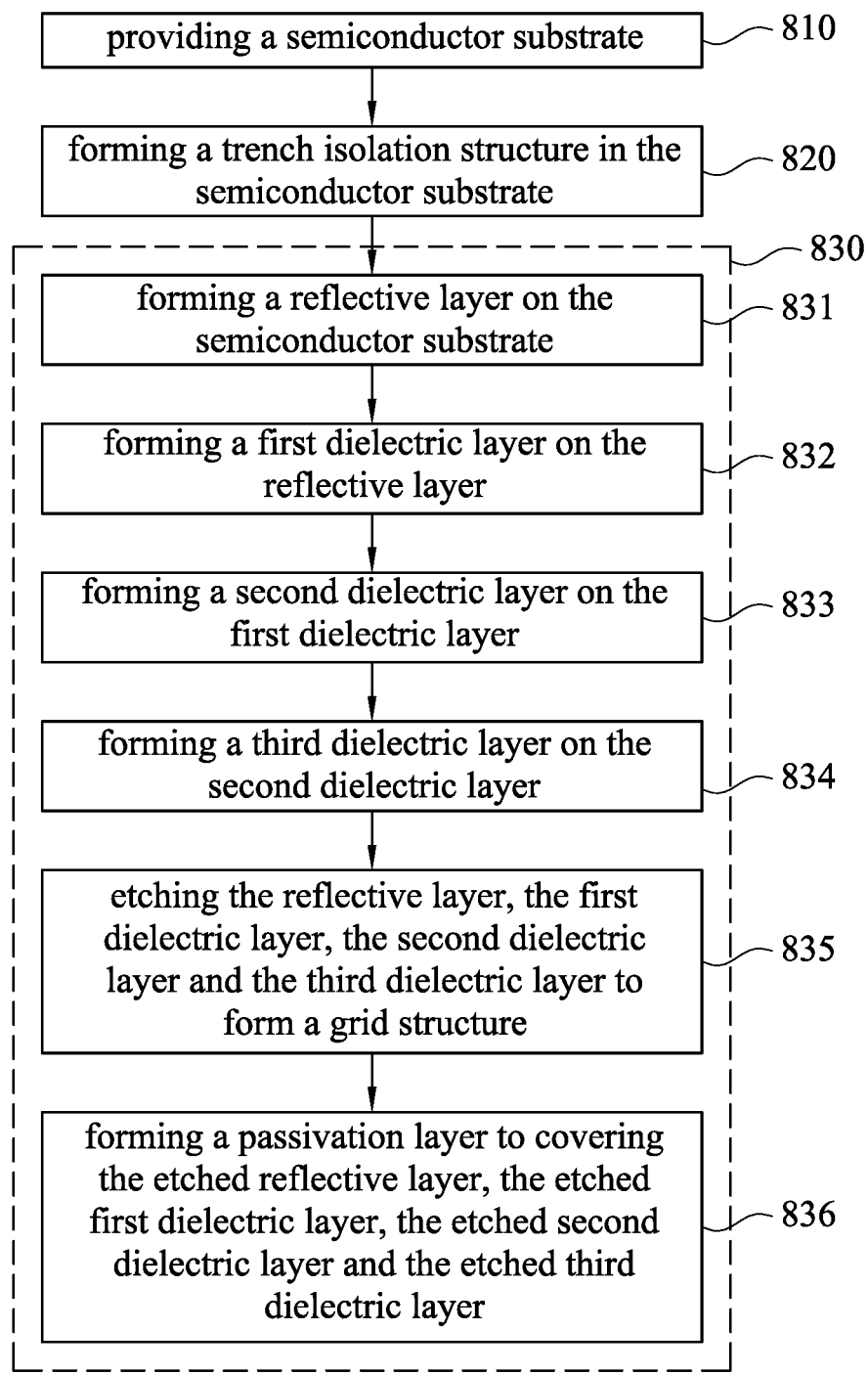
FIG. 8 is a flow chart showing a method for fabricating an isolation structure in accordance with embodiments of the present disclosure.

Referring to FIG. 8, FIG. 8 is a flow chart showing a method 800 for fabricating an isolation structure in accordance with embodiments of the present disclosure. The method 800 begins at operation 810. Operation 810 is performed to provide the semiconductor substrate 701 as shown in FIG. 7A. Then, operation 820 is performed to form the trench isolation structure 720 in the semiconductor substrate 701, as shown in FIG. 7B. Thereafter, operation 830 is performed to form a grid isolation structure on the semiconductor substrate 701. In operation 830, at first, operation 831 is performed to form the reflective layer 711 on the semiconductor substrate 701 as shown in FIG. 7C. Then, operation 832 is performed to form the first dielectric layer 712 on the reflective layer 711 as shown in FIG. 7D. Thereafter, operation 833 is performed to form the second dielectric layer 713 on the first dielectric layer 712 as shown in FIG. 7E. Then, operation 834 is performed to form the third dielectric layer 714 on the second dielectric layer 713 as shown in FIG. 7F. Thereafter, operation 835 is performed to etch the reflective layer 711, the first dielectric layer 712, the second dielectric layer 713 and the third dielectric layer 714 as shown in FIG. 7G. Then, operation 836 is performed to form the passivation layer PA7 to cover the etched reflective layer 711, the etched first dielectric layer 712, the etched second dielectric layer 713 and the etched third dielectric layer 714 to form the grid isolation structure 710 on the semiconductor substrate 701, as shown in FIG. 7H.

In addition, the method for fabricating the trench isolation structure 720 is similar to the method 500 for fabricating a trench isolation structure as shown in FIG. 5, thus the method for fabricating the trench isolation structure 720 is not repeated herein.

Referring to FIG. 9, FIG. 9 is a schematic cross-sectional view of an image sensor 900 in accordance with some embodiments of the present disclosure. In this embodiment, the image sensor 900 is a backside illuminated (BSI) image sensor, but embodiments of the present disclosure are not limited thereto. The image sensor 900 includes a semiconductor substrate 901, a grid isolation structure 910, a trench isolation structure 920, plural color filters CF9, a micro lens layer ML9 and plural light-sensitive elements PD. The grid isolation structure 910 is disposed on the semiconductor substrate 901 to define plural pixel regions PR9 on the semiconductor substrate 901. The grid isolation structure 910 is similar to the grid isolation structure 110, 210, 610 or 710, and the trench isolation structure 920 is similar to the trench isolation structures 120, 220, 620 or 720.

For example, a cross-sectional view of the grid isolation structure 910 has a shape of an isosceles trapezium. For another example, the grid isolation structure 910 has a bottom surface BS3 and a structure height H3. The bottom surface BS3 has a surface width SW3, and a ratio of the structure height H3 to the surface width SW3 is arranged to be equal to or greater than 4 to provide better isolation performance. In some embodiments, the pixel region PR9 is defined by centers of the isosceles trapeziums of the grid isolation structure 910, and a ratio of the surface width SW3 to a width of the pixel region PR9 is arranged to be equal to or smaller than about 0.2 to avoid degradation of QE (quantum efficiency). In some embodiments, the ratio of the surface width SW3 to a width of the pixel region PR9 ranges from about 0.05 to about 0.2. However, embodiments of the present disclosure are not limited thereto.

The color filters CF9 and the micro lens layer ML9 are disposed on the pixel regions PR9. The micro lens layer ML9 is conjured to collect light for the image sensor 900. The micro lens layer ML9 includes plural first portions FP9 and plural second portions SP9 located between the first portions FP9, and the second portions SP9 of the micro lens layer ML9 covers the grid isolation structure 910.

In some embodiments, the color filters CF9 includes red color filters, blue color filters and green color filters disposed on the pixel regions PR9 in a one-to-one manner. Each of the color filters CF9 has a filter height (or a thickness) H4, and a ratio of the structure height H3 to the filter height H4 ranges is about 1. In some embodiments, the ratio of the structure height H3 to the filter height H4 ranges from 0.8 to 1.2.

The light-sensitive elements PD are disposed corresponding to the pixel regions PR9. In some embodiments, the light-sensitive elements PD are photodiodes, but embodiments of the present invention are not limited thereto.

Since the grid isolation structure 910 is similar to the grid isolation structure 110, 210, 610 or 710, the grid isolation structure 910 has a greater height capable of providing better isolation performance for lower crosstalk and corresponding noise. Therefore, optical confinement, QE, and SNR (signal to noise ratio) of the image sensor 900 are improved accordingly.

Referring to FIG. 10, FIG. 10 is a schematic cross-sectional view of an image sensor 1000 in accordance with some embodiments of the present disclosure. In this embodiment, the image sensor 1000 is a backside illuminated (BSI) image sensor, but embodiments of the present disclosure are not limited thereto. The image sensor 1000 includes a semiconductor substrate 1001, a grid isolation structure 1010, a trench isolation structure 1020, plural color filters CF10, a micro lens layer ML10 and plural light-sensitive elements PD. The grid isolation structure 1010 is disposed on the semiconductor substrate 1001 to define plural pixel regions PR10 on the semiconductor substrate 1001. The grid isolation structure 1010 is similar to the grid isolation structure 110, 210, 610 or 710, and the trench isolation structure 1020 is similar to the trench isolation structures 120, 220, 620 or 720.

For example, a cross-sectional view of the grid isolation structure 1010 has a shape of an isosceles trapezium. For another example, the grid isolation structure 1010 has a bottom surface BS5 and a structure height H5. The bottom surface BS5 has a surface width SW5, and a ratio of the structure height H5 to the surface width SW5 is arranged to be equal to or greater than 4 to provide better isolation performance. In some embodiments, the pixel region PR10 is defined by centers of the isosceles trapeziums of the grid isolation structure 1010, and a ratio of the surface width SW5 to a width of the pixel region PR10 is arranged to be equal to or smaller than about 0.2 to avoid degradation of QE (quantum efficiency). In some embodiments, the ratio of the surface width SW5 to a width of the pixel region PR10 ranges from about 0.05 to about 0.2. However, embodiments of the present disclosure are not limited thereto.

The color filters CF10 and the micro lens layer ML10 are disposed on the pixel regions PR10. The micro lens layer ML10 is conjured to collect light for the image sensor 1000. The micro lens layer ML10 includes plural first portions FP10 and plural second portions SP10 located between the first portions FP10.

In some embodiments, the color filters CF10 includes red color filters, blue color filters and green color filters disposed on the pixel regions PR10 in a one-to-one manner. Each of the color filters CF10 has a filter height (or a thickness) H6, and a ratio of the structure height H5 to the filter height H6 is greater than 1. In other words, the structure height H5 is greater than the filter height H6, and the micro lens layer ML10 is split by the grid isolation structure 1010. Because the structure height H5 is greater than the filter height H6, the color filters CF10 can be totally disposed in the cavities of the grid isolation structure 1010, and a bottom surface BSML of the micro lens layer ML10 is located below the top of the grid isolation structure 1010.

In accordance with an embodiment of the present disclosure, the present disclosure discloses an isolation structure. The isolation structure includes a reflective layer, a first dielectric layer, a second dielectric layer and a passivation layer. The first dielectric layer is disposed on the reflective layer. The second dielectric layer is disposed on the first dielectric layer. The passivation layer covers the reflective layer, the first dielectric layer and the second dielectric layer. A dielectric constant of the first dielectric layer is different from that of the second dielectric layer.

In accordance with another embodiment of the present disclosure, the present disclosure discloses method for fabricating an isolation structure. In the method, at first, a semiconductor substrate is provided. Then, a grid isolation structure is formed on the semiconductor substrate. In the operation for forming the grid isolation structure, at first, a first reflective layer is formed on the semiconductor substrate. Then, a first dielectric layer is formed on the reflective layer. Thereafter, a second dielectric layer is formed on the first dielectric layer, in which a dielectric constant of the first dielectric layer is different from that of the second dielectric layer. Then, the first reflective layer, the first dielectric layer and the second dielectric layer are etched to form a grid structure. Thereafter, a passivation layer is formed to cover the etched first reflective layer, the etched first dielectric layer and the etched second dielectric layer.

In accordance with another embodiment of the present disclosure, the present disclosure discloses an image sensor. The image sensor includes a semiconductor substrate, a grid isolation structure and plural light-sensitive elements. The grid isolation structure is disposed on the semiconductor substrate to define plural pixel regions. The grid isolation structure includes a reflective layer, a first dielectric layer, a second dielectric layer and a passivation layer. The first dielectric layer is disposed on the reflective layer. The second dielectric layer is disposed on the first dielectric layer. The passivation layer covers the reflective layer, the first dielectric layer and the second dielectric layer. A dielectric constant of the first dielectric layer is different from that of the second dielectric layer. The light-sensitive elements are disposed corresponding to the pixel regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An isolation structure, comprising:
    a reflective layer;
    a first dielectric layer disposed on the reflective layer;
    a second dielectric layer disposed on the first dielectric layer; and
    a third dielectric layer disposed on the second dielectric layer, wherein the second dielectric layer is located between the first dielectric layer and the third dielectric layer and a dielectric constant of the first dielectric layer is different from that of the second dielectric layer.

2. The isolation structure of claim 1, wherein the dielectric constant of the first dielectric layer is greater than that of the second dielectric layer, and the dielectric constant of the second dielectric layer is greater than that of the third dielectric layer.

3. The isolation structure of claim 1, wherein the dielectric constant of the first dielectric layer is smaller than that of the second dielectric layer, and the dielectric constant of the second dielectric layer is smaller than that of the third dielectric layer.

4. The isolation structure of claim 1, wherein the reflective layer is formed from metal.

5. The isolation structure of claim 1, wherein the isolation structure has a bottom surface comprising a portion of the reflective layer, the bottom surface has a surface width, the isolation structure has a structure height, and a ratio of the structure height to the surface width is equal to or greater than 4.

6. The isolation structure of claim 1, wherein the first dielectric layer and the second dielectric layer are formed from silicon oxide, silicon nitride, silicon oxynitride or silicon carbide.

7. An image sensor, comprising:
    a semiconductor substrate;
    a grid isolation structure disposed on the semiconductor substrate to define a plurality of pixel regions, wherein the grid isolation structure comprises:
        a reflective layer;
        a first dielectric layer disposed on the reflective layer; and
        a second dielectric layer disposed on the first dielectric layer, wherein a dielectric constant of the first dielectric layer is different from that of the second dielectric layer; and
    a plurality of light-sensitive elements disposed corresponding to the pixel regions.

8. The image sensor of claim 7, wherein the grid isolation structure has a bottom surface comprising a portion of the reflective layer, the bottom surface has a surface width, each of the pixel regions has a pixel width, and a ratio of the surface width to the pixel width is substantially equal to or smaller than 0.2.

9. The image sensor of claim 7, wherein the light-sensitive elements are photodiodes.

10. The image sensor of claim 7, further comprising a micro lens layer disposed on the pixel regions and covering the grid isolation structure.

11. An isolation structure, comprising:
    a grid isolation structure disposed on the semiconductor substrate to define a plurality of pixel regions, wherein the grid isolation structure comprises:
        a reflective layer;
        a first dielectric layer disposed on the reflective layer; and
        a second dielectric layer disposed on the first dielectric layer, wherein a dielectric constant of the first dielectric layer is different from that of the second dielectric layer; and
    a trench isolation structure disposed in the semiconductor substrate and under the grid isolation structure, wherein trench isolation structure comprises:

a trench in the semiconductor substrate;

a trench dielectric layer covering the semiconductor substrate, wherein the trench dielectric layer has a trench portion located in the trench of the semiconductor substrate; and a trench reflective layer disposed on the trench portion of the trench dielectric layer.

12. The isolation structure of claim 11, further comprising a third dielectric layer disposed on the second dielectric layer, wherein the second dielectric layer is located between the first dielectric layer and the third dielectric layer.

13. The isolation structure of claim 12, wherein the dielectric constant of the first dielectric layer is greater than that of the second dielectric layer, and the dielectric constant of the second dielectric layer is greater than that of the third dielectric layer.

14. The isolation structure of claim 12, wherein the dielectric constant of the first dielectric layer is smaller than that of the second dielectric layer, and the dielectric constant of the second dielectric layer is smaller than that of the third dielectric layer.

15. The isolation structure of claim 11, wherein the reflective layer is formed from metal.

16. The isolation structure of claim 11, wherein the isolation structure has a bottom surface comprising a portion of the reflective layer, the bottom surface has a surface width, the isolation structure has a structure height, and a ratio of the structure height to the surface width is equal to or greater than 4.

17. The isolation structure of claim 11, wherein the first dielectric layer and the second dielectric layer are formed from silicon oxide, silicon nitride, silicon oxynitride or silicon carbide.

18. The isolation structure of claim 11, wherein the trench dielectric layer is formed from high-k dielectric material.

19. The isolation structure of claim 11, wherein the trench reflective layer covers the trench dielectric layer.

20. The isolation structure of claim 1, further comprising a passivation layer covering the third dielectric layer.

* * * * *